(12) United States Patent
Li

(10) Patent No.: US 8,880,982 B2
(45) Date of Patent: Nov. 4, 2014

(54) WIRELESS COMMUNICATION APPARATUS

(75) Inventor: Jifeng Li, Kanagawa (JP)

(73) Assignee: Panasonic Corporation, Osaka (JP)

( * ) Notice: Subject to any disclaimer, the term of this patent is extended or adjusted under 35 U.S.C. 154(b) by 366 days.

(21) Appl. No.: 13/147,737

(22) PCT Filed: Dec. 10, 2009

(86) PCT No.: PCT/JP2009/006771
§ 371 (c)(1),
(2), (4) Date: Aug. 3, 2011

(87) PCT Pub. No.: WO2010/089834
PCT Pub. Date: Aug. 12, 2010

(65) Prior Publication Data
US 2011/0296285 A1    Dec. 1, 2011

(30) Foreign Application Priority Data

Feb. 5, 2009    (JP) ................. 2009-025121

(51) Int. Cl.
| | |
|---|---|
| *H03M 13/00* | (2006.01) |
| *H04L 1/00* | (2006.01) |
| *H03M 13/25* | (2006.01) |
| *H03M 13/35* | (2006.01) |
| *H03M 13/27* | (2006.01) |

(52) U.S. Cl.
CPC ........... *H03M 13/258* (2013.01); *H04L 1/0041* (2013.01); *H03M 13/2739* (2013.01); *H03M 13/256* (2013.01); *H03M 13/356* (2013.01); *H03M 13/6356* (2013.01); *H04L 1/0059* (2013.01)
USPC .......................................... 714/776; 714/755

(58) Field of Classification Search
CPC ...................... H03M 13/2942; H03M 13/3761
USPC ............................................... 714/776, 755
See application file for complete search history.

(56) References Cited

U.S. PATENT DOCUMENTS

| | | | | |
|---|---|---|---|---|
| 5,844,918 A | * | 12/1998 | Kato ............................. | 714/751 |
| 5,953,377 A | * | 9/1999 | Yoshida ....................... | 375/295 |

(Continued)

FOREIGN PATENT DOCUMENTS

| | | |
|---|---|---|
| CN | 1393089 | 1/2003 |
| EP | 1 971 098 | 9/2008 |

(Continued)

OTHER PUBLICATIONS

International Search Report dated Mar. 9, 2010.

(Continued)

*Primary Examiner* — M. Mujtaba K Chaudry
(74) *Attorney, Agent, or Firm* — Dickinson Wright PLLC

(57) ABSTRACT

Disclosed is a wireless communication apparatus in which reception precision characteristics are improved, by specially adapting the modulating processing in respect of the code words for each encoding system. A wireless communication apparatus (100) wherein an encoding processing section (120) includes a convolutional encoder that performs convolutional encoding of fixed information blocks made up of K bits. In code word partial sequences obtained on the basis of the head and tail in a fixed information block, a modulating section (130) maps bits, from bit groups constituting single symbols, to bits associated with groups having poor quality characteristics, prioritising systematic bits over parity bits. In this way, the reception quality characteristics in first code word partial sequences having good error characteristics is equalised. Consequently, since portions having poor reception quality characteristics are prevented from prominent appearance in the first code word partial sequence, the result is that the reception quality characteristics and system throughput can be improved.

5 Claims, 10 Drawing Sheets

(56) References Cited

U.S. PATENT DOCUMENTS

| | | | |
|---|---|---|---|
| 6,314,289 B1 * | 11/2001 | Eberlein et al. | 455/427 |
| 6,681,365 B1 | 1/2004 | Anand | |
| 6,704,370 B1 * | 3/2004 | Chheda et al. | 375/299 |
| 8,270,525 B2 * | 9/2012 | Nakagawa et al. | 375/286 |
| 2002/0163975 A1 | 11/2002 | Uesugi | |
| 2003/0031233 A1 | 2/2003 | Kim | |
| 2004/0243903 A1 | 12/2004 | Pan | |
| 2005/0108610 A1 | 5/2005 | Kim | |

FOREIGN PATENT DOCUMENTS

| | | |
|---|---|---|
| JP | 2001/203588 | 7/2001 |
| JP | 2002/171298 | 6/2002 |
| JP | 2003/023373 | 1/2003 |
| JP | 2005/151571 | 6/2005 |

OTHER PUBLICATIONS

3GPP TS 36.211 V8.0.0, "3rd Generation Partnership Project; Technical Specification Group Radio Access Network; Evolved Universal Terrestrial Radio Access (E-UTRA); Physical channels and modulation (Release 8)," Sep. 2007, pp. 1-50, p. 3, Line 4.

C. Berrou, et al., "New Optimum Error Correcting Coding and Decoding: Turbo-Codes," IEEE Transactions on Communications, vol. 44, No. 10, Oct. 1996, pp. 1261-1271, p. 3, Line 6.

Supplementary European Search Report dated May 6, 2013.

T. Duman, et al., "Performance Bounds for Turbo-Coded Modulation Systems," IEEE Transactions on Communications, vol. 47, No. 4, XP 011009383, Apr. 1999, pp. 511-521.

English translation of Search Report from annex of Chinese Office Action dated Dec. 3, 2013.

* cited by examiner

| $i$ | $K_i$ | $f_1$ | $f_2$ | $i$ | $K_i$ | $f_1$ | $f_2$ | $i$ | $K_i$ | $f_1$ | $f_2$ | $i$ | $K_i$ | $f_1$ | $f_2$ |
|---|---|---|---|---|---|---|---|---|---|---|---|---|---|---|---|
| 1 | 40 | 3 | 10 | 48 | 416 | 25 | 52 | 95 | 1120 | 87 | 140 | 142 | 3200 | 111 | 240 |
| 2 | 48 | 7 | 12 | 49 | 424 | 51 | 106 | 96 | 1152 | 35 | 72 | 143 | 3264 | 443 | 204 |
| 3 | 56 | 19 | 42 | 50 | 432 | 47 | 72 | 97 | 1184 | 19 | 74 | 144 | 3328 | 51 | 104 |
| 4 | 64 | 7 | 16 | 51 | 440 | 91 | 110 | 98 | 1216 | 39 | 76 | 145 | 3392 | 51 | 212 |
| 5 | 72 | 7 | 18 | 52 | 448 | 29 | 168 | 99 | 1248 | 19 | 78 | 146 | 3456 | 451 | 192 |
| 6 | 80 | 11 | 20 | 53 | 456 | 29 | 114 | 100 | 1280 | 199 | 240 | 147 | 3520 | 257 | 220 |
| 7 | 88 | 5 | 22 | 54 | 464 | 247 | 56 | 101 | 1312 | 21 | 82 | 148 | 3584 | 57 | 336 |
| 8 | 96 | 11 | 24 | 55 | 472 | 29 | 118 | 102 | 1344 | 211 | 252 | 149 | 3648 | 313 | 228 |
| 9 | 104 | 7 | 26 | 56 | 480 | 89 | 180 | 103 | 1376 | 21 | 96 | 150 | 3712 | 271 | 232 |
| 10 | 112 | 41 | 84 | 57 | 488 | 91 | 122 | 104 | 1408 | 43 | 88 | 151 | 3776 | 179 | 236 |
| 11 | 120 | 103 | 90 | 58 | 496 | 157 | 62 | 105 | 1440 | 149 | 80 | 152 | 3840 | 331 | 120 |
| 12 | 128 | 15 | 32 | 59 | 504 | 55 | 84 | 106 | 1472 | 45 | 82 | 153 | 3904 | 363 | 244 |
| 13 | 136 | 9 | 34 | 60 | 512 | 31 | 64 | 107 | 1504 | 49 | 846 | 154 | 3968 | 375 | 248 |
| 14 | 144 | 17 | 108 | 61 | 528 | 17 | 66 | 108 | 1536 | 71 | 48 | 155 | 4032 | 127 | 168 |
| 15 | 152 | 9 | 38 | 62 | 544 | 35 | 68 | 109 | 1568 | 13 | 28 | 156 | 4096 | 31 | 64 |
| 16 | 160 | 21 | 120 | 63 | 560 | 227 | 420 | 110 | 1600 | 17 | 80 | 157 | 4160 | 33 | 130 |
| 17 | 168 | 101 | 84 | 64 | 576 | 65 | 96 | 111 | 1632 | 25 | 102 | 158 | 4224 | 43 | 264 |
| 18 | 176 | 21 | 44 | 65 | 592 | 19 | 74 | 112 | 1664 | 183 | 104 | 159 | 4288 | 33 | 134 |
| 19 | 184 | 57 | 46 | 66 | 608 | 37 | 76 | 113 | 1696 | 55 | 954 | 160 | 4352 | 477 | 408 |
| 20 | 192 | 23 | 48 | 67 | 624 | 41 | 234 | 114 | 1728 | 127 | 86 | 161 | 4416 | 35 | 138 |
| 21 | 200 | 13 | 50 | 68 | 640 | 39 | 80 | 115 | 1760 | 27 | 110 | 162 | 4480 | 233 | 280 |
| 22 | 208 | 27 | 52 | 69 | 656 | 185 | 82 | 116 | 1792 | 29 | 112 | 163 | 4544 | 357 | 142 |
| 23 | 216 | 11 | 36 | 70 | 672 | 43 | 252 | 117 | 1824 | 29 | 114 | 164 | 4608 | 337 | 480 |
| 24 | 224 | 27 | 56 | 71 | 688 | 21 | 86 | 118 | 1856 | 57 | 116 | 165 | 4672 | 37 | 146 |
| 25 | 232 | 85 | 58 | 72 | 704 | 155 | 44 | 119 | 1888 | 45 | 354 | 166 | 4736 | 71 | 444 |
| 26 | 240 | 29 | 60 | 73 | 720 | 79 | 120 | 120 | 1920 | 31 | 120 | 167 | 4800 | 71 | 120 |
| 27 | 248 | 33 | 62 | 74 | 736 | 139 | 92 | 121 | 1952 | 59 | 610 | 168 | 4864 | 37 | 152 |
| 28 | 256 | 15 | 32 | 75 | 752 | 23 | 94 | 122 | 1984 | 186 | 124 | 169 | 4928 | 39 | 462 |
| 29 | 264 | 17 | 198 | 76 | 768 | 217 | 48 | 123 | 2016 | 113 | 420 | 170 | 4992 | 127 | 234 |
| 30 | 272 | 33 | 68 | 77 | 784 | 25 | 98 | 124 | 2048 | 31 | 64 | 171 | 5056 | 39 | 158 |
| 31 | 280 | 103 | 210 | 78 | 800 | 17 | 80 | 125 | 2112 | 17 | 66 | 172 | 5120 | 39 | 80 |
| 32 | 288 | 19 | 36 | 79 | 816 | 127 | 102 | 126 | 2176 | 171 | 136 | 173 | 5184 | 31 | 96 |
| 33 | 296 | 19 | 74 | 80 | 832 | 25 | 52 | 127 | 2240 | 209 | 420 | 174 | 5248 | 113 | 902 |
| 34 | 304 | 37 | 76 | 81 | 848 | 239 | 106 | 128 | 2304 | 253 | 216 | 175 | 5312 | 41 | 168 |
| 35 | 312 | 19 | 78 | 82 | 864 | 17 | 48 | 129 | 2368 | 367 | 444 | 176 | 5376 | 251 | 339 |
| 36 | 320 | 21 | 120 | 83 | 880 | 137 | 116 | 130 | 2432 | 265 | 456 | 177 | 5440 | 43 | 173 |
| 37 | 328 | 21 | 82 | 84 | 896 | 215 | 112 | 131 | 2496 | 181 | 468 | 178 | 5504 | 21 | 86 |
| 38 | 336 | 115 | 84 | 85 | 912 | 29 | 114 | 132 | 2560 | 39 | 80 | 179 | 5568 | 43 | 174 |
| 39 | 344 | 193 | 33 | 86 | 928 | 15 | 58 | 133 | 2624 | 27 | 164 | 180 | 5632 | 45 | 173 |
| 40 | 352 | 21 | 44 | 87 | 944 | 147 | 118 | 134 | 2688 | 127 | 504 | 181 | 5696 | 45 | 173 |
| 41 | 360 | 133 | 90 | 88 | 960 | 29 | 60 | 135 | 2752 | 143 | 172 | 182 | 5760 | 161 | 120 |
| 42 | 368 | 81 | 46 | 89 | 976 | 59 | 122 | 136 | 2816 | 43 | 88 | 183 | 5824 | 89 | 182 |
| 43 | 376 | 45 | 94 | 90 | 992 | 85 | 124 | 137 | 2880 | 29 | 300 | 184 | 5888 | 323 | 184 |
| 44 | 384 | 23 | 48 | 91 | 1008 | 55 | 84 | 138 | 2944 | 45 | 92 | 185 | 5952 | 47 | 186 |
| 45 | 392 | 243 | 98 | 92 | 1024 | 31 | 64 | 139 | 3008 | 157 | 188 | 186 | 6016 | 23 | 94 |
| 46 | 400 | 151 | 40 | 93 | 1056 | 17 | 66 | 140 | 3072 | 47 | 96 | 187 | 6080 | 47 | 190 |
| 47 | 408 | 155 | 102 | 94 | 1088 | 171 | 204 | 141 | 3136 | 13 | 28 | 188 | 6144 | 263 | 480 |

FIG.7

WIRELESS COMMUNICATION APPARATUS

TECHNICAL FIELD

The present invention relates to a radio communication apparatus for transmitting a signal on which error correction encoding is performed.

BACKGROUND ART

In mobile communication which has become widespread toady, communication with high accuracy is required in various channel environments. Further, as a means to realize communication with high accuracy even in severe channel environments, error correction encoding processing is performed on transmission data.

In 3GPP (see Non-Patent Literature 1), a plurality of fixed information Hocks formed with a predetermined number of bits K are formed from a series of transmission sequences, and error correction encoding processing is performed per this fixed information block. There is no problem when that series of transmission data sequences can be divided by K. In contrast to this, when that series of transmission data sequences cannot be divided by K, bit padding is performed on that series of transmission data sequences to arrange padding bits in the head part of that series of transmission data sequences, so that the total number of bits is made a number that can be divided by K. Then, encoding processing is performed on the data sequences in which padding bits are arranged, per fixed information block. By this means, it is possible to perform encoding processing of constraint length K uniformly.

Further, error correction encoding schemes include convolutional encoding scheme (for example, see Patent Literature 1) and turbo encoding scheme (for example, see Non-Patent Literature 2).

Then, modulation processing is performed on the codewords obtained by error correction encoding processing in modulation section. A constituent bit group that forms a symbol that is obtained by m-ary modulation can be divided into groups according to BER characteristics based on the constellation (for example, see Patent Literature 2). For example, when gray-coded constellation is used, in 16 QAM, the first and second bits, out of four constituent bits, show good BER characteristics. Further, in 64 QAM, the first to third bits, out of six constituent bits, show good BER characteristics.

CITATION LIST

Patent Literature

PTL 1
Japanese Patent Application Laid-Open No. 2001-203588
PTL 2
Japanese Patent Application Laid-Open No. 2002-171298

Non-Patent Literature

NPL 1
3GPP TS36.211V800
NPL 2
Claude Berrou, "Near Optimum Error Correcting Coding And Decoding: Turbo-Codes," IEEE Trans. On Communications, Vol. 44, No. 10, October 1996.

SUMMARY OF INVENTION

Technical Problem

By the way, generally, it is known that reception accuracy characteristics at a receiving side varies depending on encoding processing at a transmitting side.

However, generally, in modulation processing, no consideration has been made for characteristics of convolutional encoding or turbo encoding and reception accuracy characteristics.

It is therefore an object of the present invention to provide a radio communication apparatus for improving reception accuracy characteristics by devising modulation processing on codewords for each encoding scheme.

Solution to Problem

A radio communication apparatus according to the present invention employs a configuration to have an encoding section that encodes a fixed information block formed with K bits; and a modulation section that performs m-ary modulation on a codeword sequence obtained by encoding processing in the encoding section, and, in a codeword subsequence that is obtained based on a head part and a tail part of the fixed information block, maps a systematic bit with priority over a parity bit to a bit having poor quality characteristics in a group of bits forming one symbol.

Advantageous Effects of Invention

According to the present invention, it is possible to provide a radio communication apparatus for improving reception accuracy characteristics by devising modulation processing on codewords for each encoding scheme.

BRIEF DESCRIPTION OF DRAWINGS

FIG. 7 shows a table showing interleaver parameters used in the interleaver shown in FIG. 6;

DESCRIPTION OF EMBODIMENTS

Figure 1:
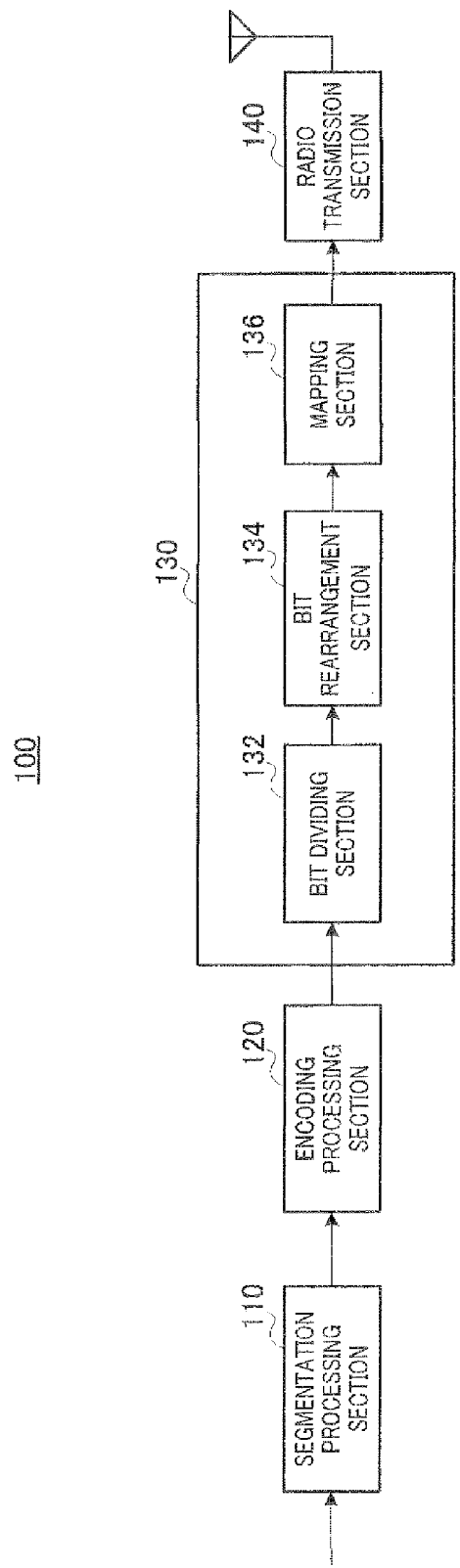
FIG. 1 is a block diagram showing a radio communication apparatus according to Embodiment 1 of the present invention.

Now, embodiments of the present invention will be described in detail with reference to the accompanying drawings. In embodiments, the same parts will be assigned the same reference numerals and overlapping explanations will be omitted.

Embodiment 1

FIG. 1 is a block diagram showing radio communication apparatus 100 according to Embodiment 1 of the present invention. In FIG. 1, radio communication apparatus 100 is provided with segmentation processing section 110, encoding processing section 120, modulation section 130, and radio transmission section 140.

Segmentation processing section 110 divides a transmission data sequence into a plurality of divided blocks and outputs each divided block to encoding processing section 120.

Figure 2:
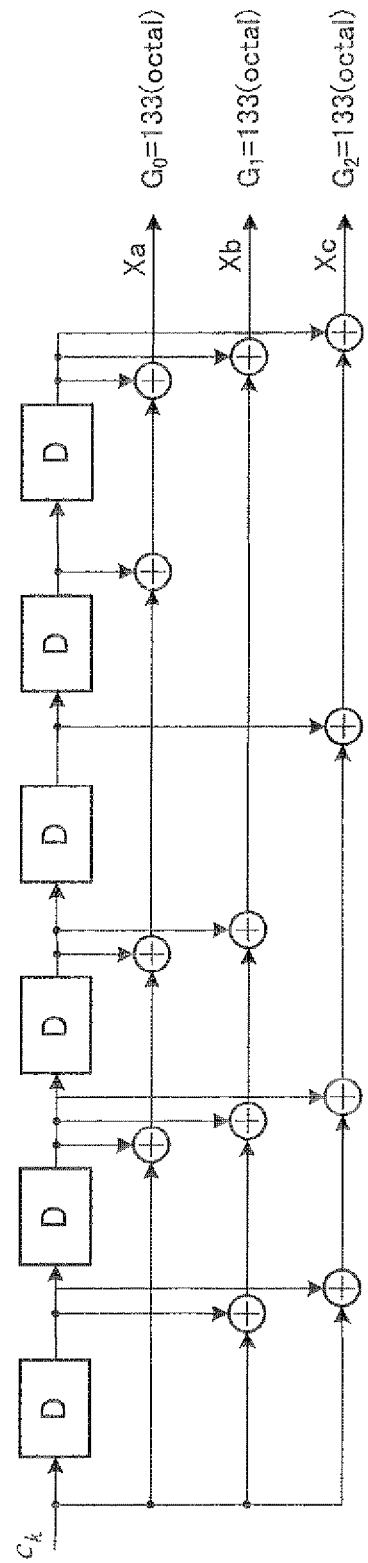
FIG. 2 shows an example of a convolutional encoder.

Encoding processing section 120 contains a convolutional encoder. This convolutional encoder receives as input a fixed information block formed with K bits, and performs convolutional encoding processing per fixed information block. The convolutional encoder performs convolutional encoding processing at code constraint length V. Code constraint length V is the number adding one to the number of shift registers that are provided in the convolutional encoder. FIG. 2 shows an example of a convolutional encoder. The convolutional encoder shown in FIG. 2 is configured to have six shift registers. Therefore, code constraint length V is 7. In FIG. 2, Xa indicates a systematic bit, Xb and Xc indicate a parity bit. In this regard, the divided block to input to encoding processing section 120 is usually formed with K bits, but if the number of bits falls below K, bit padding is performed.

Modulation section 130 modulates the codeword sequence obtained in encoding processing section 120. When performing this modulation, in the first codeword subsequence that is obtained based on the head part and the tail part of the fixed information block, a systematic bit with priority over a parity bit is mapped to a bit that belongs to a group having poor quality characteristics in the group of bits forming one symbol.

Specifically, modulation section 130 is provided with bit dividing section 132, bit rearrangement section 134, and mapping section 136.

Bit dividing section 132 divides the input codeword sequence to the first codeword subsequence and the second codeword subsequence.

Bit rearrangement section 134 arranges a group of sequence constituent bits that forms the first codeword subsequence so that the bits are separated into systematic bits and parity bits.

Mapping section 136 receives as input the first codeword subsequence and the second codeword subsequence that are arranged in bit rearrangement section 134, and maps each of the first codeword subsequence and the second codeword subsequence. Mapping section 136, especially in the first codeword subsequence, maps a systematic bit with priority over a parity bit to a bit that belongs to a. group having poor quality characteristics.

Radio transmission section 140 performs radio transmission processing, such as D/A conversion and up-conversion, on the modulated signal obtained in modulation section 130, and transmits the obtained radio signal via an antenna.

An operation of radio communication apparatus 100 having the above configuration will be described below.

First, the divided block formed in segmentation processing section 110 is input to encoding processing section 120.

In encoding processing section 120, convolutional encoding processing is performed per fixed information block, and a codeword sequence is output.

In modulation section 130, mapping processing is performed on the codeword sequence obtained in encoding processing section 120.

Figure 3:
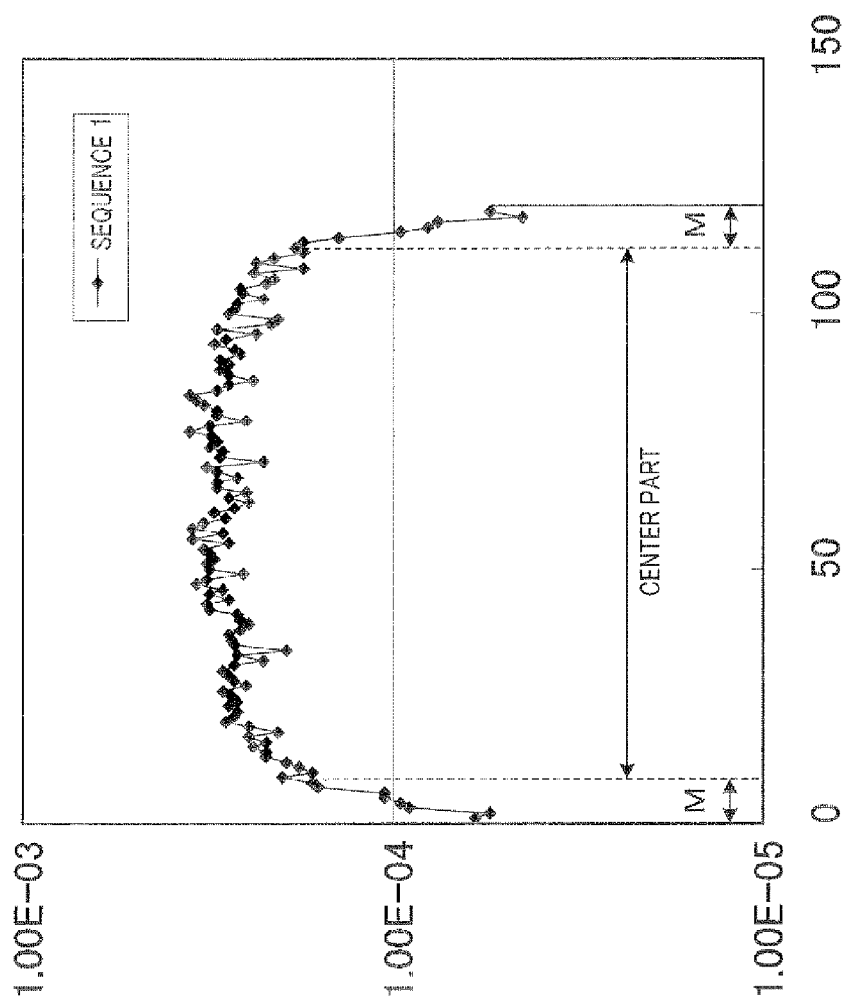
FIG. 3 shows error characteristics per bit position in a fixed information block with code constraint length K (convolutional encoding scheme)

Here, error characteristics per bit position in a fixed information block formed with K bits when convolutional encoding is employed is shown in FIG. 3. In FIG. 3, the horizontal axis indicates a bit position and the vertical axis indicates a bit error rate (BER).

As shown in FIG. 3, the BER of the bit position group in the center part, not including the head part and the tail part of the fixed information block, is poor. On the other hand, the BER in the head part and the tail part, each formed with M bits, is better than the BER in the center part. Here, M bits are proportional to code constraint length V.

That is, in the fixed information block immediately before being input into the convolutional encoder, the head part and the tail part, each of which is formed with M bits, tend to show better BER than the BER in the center part. That is, the difference of BER characteristics arises between the first codeword subsequence that is obtained based on the head part and the tail part and the second codeword subsequence that is obtained based on the center part, not including the head part and the tail part, in the fixed information block. This is caused because tail bits are added to the tail of a fixed information block, so that all shift register values provided in the convolutional encoder are returned to 0.

Therefore, modulation section 130, in the first codeword subsequence having better error characteristics than the second codeword subsequence, maps a systematic bit with priority over a parity bit to a bit that belongs to a group having poor quality characteristics in the group of bits forming one symbol.

Figure 4:
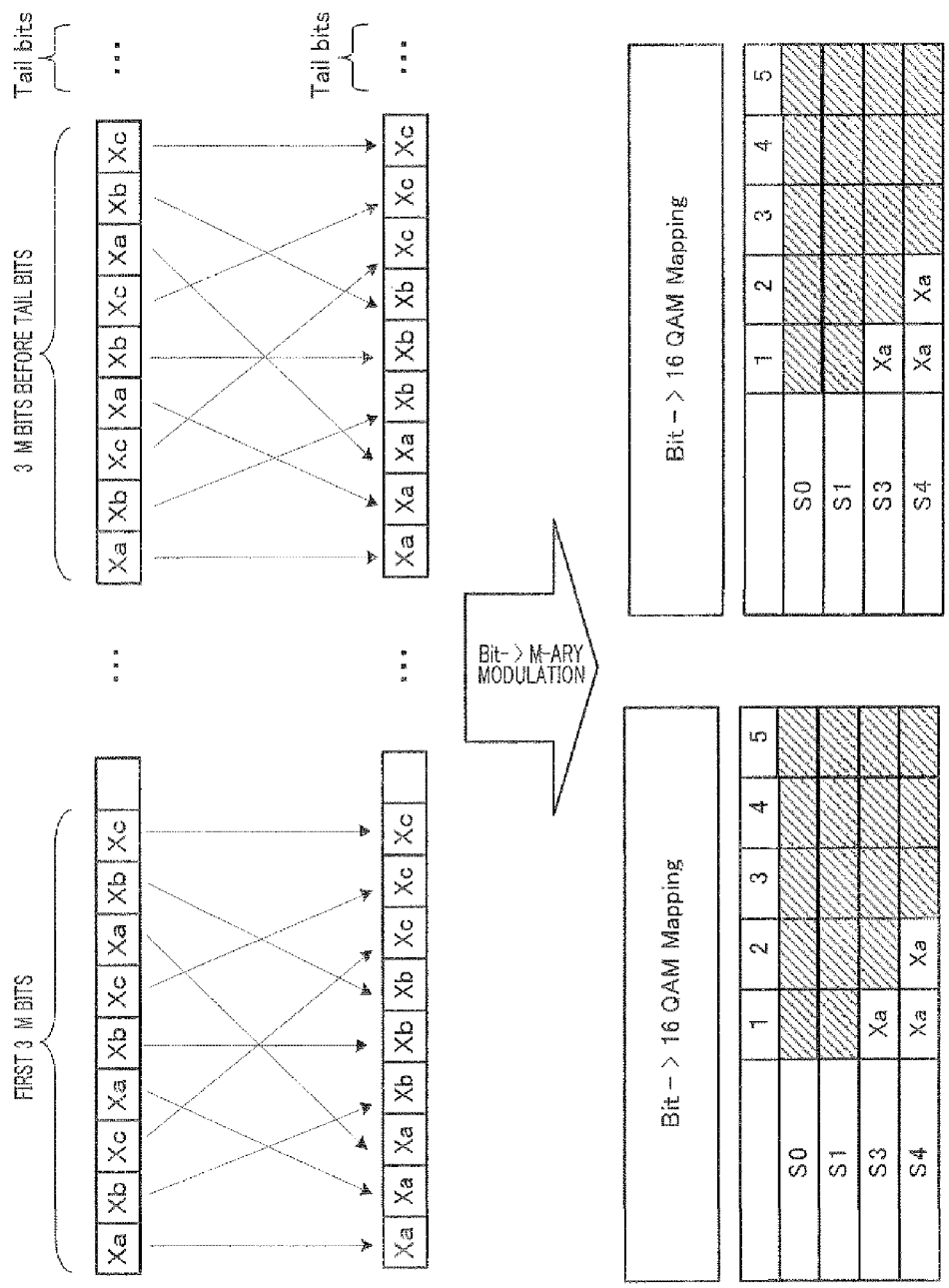
FIG. 4 shows processing in the modulation section shown in FIG. 1.

FIG. 4 shows processing in modulation section 130. FIG. 4 shows, in particular, a case where the coding rate is ⅓ and the modulation scheme is 16 QAM. Further, Xa in FIG. 4 indicates a systematic bit, Xb and Xc indicate a parity bit, and Xa, Xb, and Xc correspond to the reference numerals in FIG. 2.

In modulation section 130, as shown in the upper part in FIG. 4, bit rearrangement section 134 arranges a group of sequence constituent bits that forms the first codeword subsequence (the first 3×M bits and 3×M bits before tail bits in FIG. 4) so that the bits are separated into systematic bits and parity bits.

Then, as shown in the lower part in FIG. 4, in the first codeword subsequence, mapping section 136 maps a systematic bit with priority over a parity bit to a bit that belongs to a group having poor quality characteristics.

By this means, it is possible to smooth the reception quality characteristics in the first codeword subsequence having good error characteristics. Therefore, it is possible to prevent part having significantly poor reception quality characteristics from arising in the first codeword subsequence, consequently making it possible to improve the system throughput.

As described above, according to the present invention, in radio communication apparatus 100, encoding processing section 120 contains a convolutional encoder that performs convolutional encoding on a fixed information block formed with K bits, and modulation section 130, in a codeword subsequence that is obtained based on the head part and the tail part of a fixed information block, maps a systematic bit with priority over a parity bit to a bit that belongs to a group having poor quality characteristics in the group of bits forming one symbol.

By this means, it is possible to smooth the reception quality characteristics in the first codeword subsequence having good error characteristics. Therefore, it is possible to prevent part having significantly poor reception quality characteristics from arising in the first codeword subsequence, consequently making it possible to improve reception quality characteristics and system throughput.

Embodiment 2

A case has been described with Embodiment 1 where a convolutional encoding scheme is employed. In contrast to this, a case will be described below with the present embodiment where a turbo encoding scheme is employed.

Figure 5:
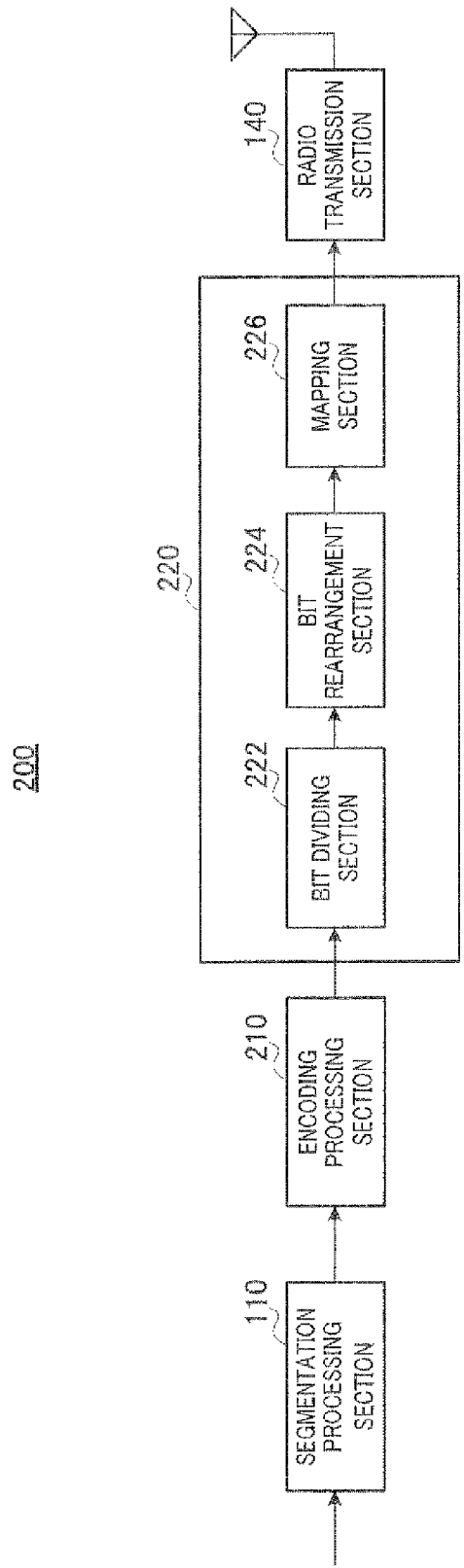
FIG. 5 is a block diagram showing a radio communication apparatus according to Embodiment 2 of the present invention.

FIG. 5 is a block diagram showing radio communication apparatus 200 according to Embodiment 2 of the present invention. In FIG. 5, radio communication apparatus 200 is provided with encoding processing section 210 and modulation section 220.

Encoding processing section 210 contains a convolutional encoder. This convolutional encoder receives as input a fixed information block formed with K bits, and performs convolutional encoding processing per fixed information block. The convolutional encoder performs convolutional encoding processing at code constraint length V. Code constraint length V is the number adding one to the number of shift registers that are provided in the convolutional encoder.

Figure 6:
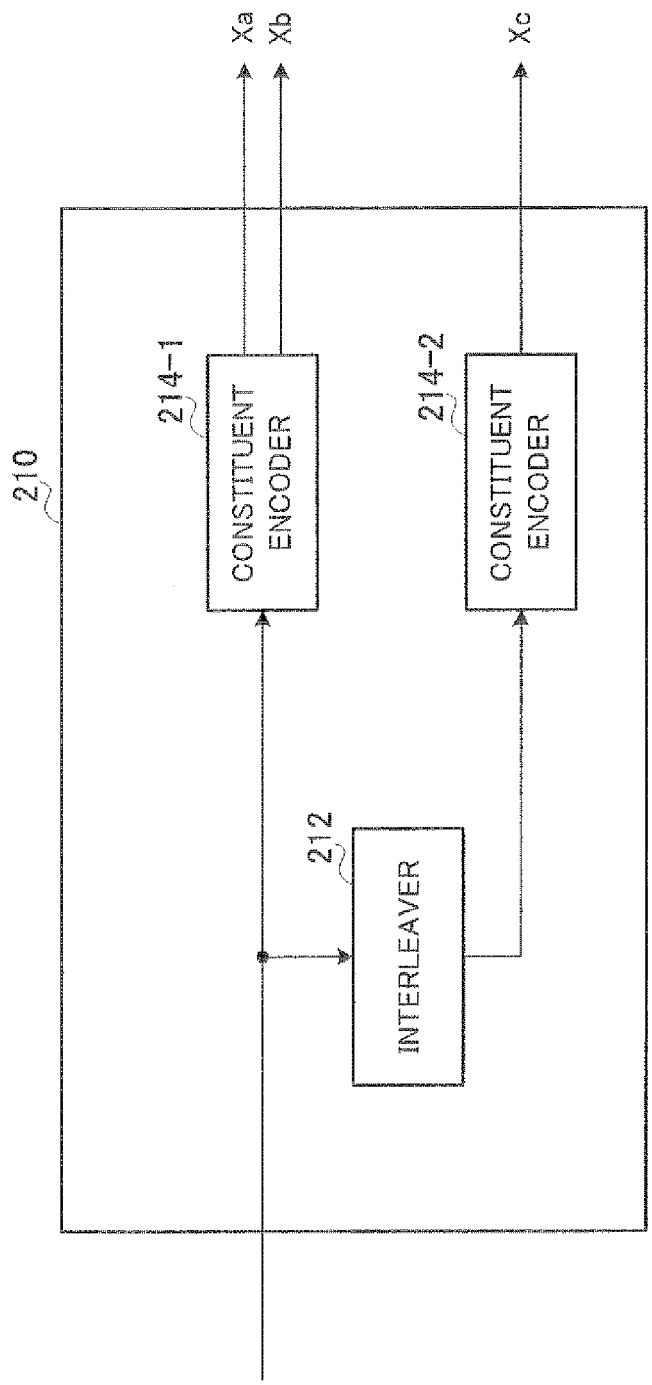
FIG. 6 is a block diagram showing a configuration of the encoding processing section in FIG. 5.

Specifically, encoding processing section 210 is provided with interleaver 212 and constituent encoders 214-1, 2, as shown in FIG. 6. Further, the above-described convolutional encoder is provided in each of constituent encoders 214-1, 2.

Interleaver 212 receives as input a fixed information block and performs interleaving processing on this fixed information block using a predetermined interleaving pattern.

This interleaving processing is represented by the following equation:

$$c'_i = c_{\Pi(i)}$$

where a bit sequence of the fixed information block is expressed by $c_0, c_1, \ldots c_{K-1}$ and an interleaved bit sequence is expressed by $c'_0, c'_1, \ldots c'_{K-1}$. Further, i=0, 1, ..., (K−1) and $\Pi(i) = (f_1 i + f_2 \cdot i^2)$ modK are satisfied, and $f_1$ and $f_2$ are natural numbers depending on K.

For example, it is possible to use a table in FIG. 7 for interleaver parameters for i, Ki, f1, and f2.

Constituent encoders 214-1, 2 perform convolutional encoding processing on the input data sequence. Constituent encoder 214-1 performs convolutional encoding processing on the fixed information block itself. Constituent encoder 214-2 performs convolutional encoding processing on the fixed information block interleaved in interleaver 212.

Modulation section 220 modulates the codeword sequence obtained in encoding processing section 210. When performing this modulation, in the first codeword subsequence that is obtained based on the head part and the tail part of the fixed information block, a systematic bit with priority over a parity bit is mapped to a bit that belongs to a group having poor quality characteristics in the group of bits forming one symbol.

Specifically, modulation section 220 is provided with bit dividing section 222, bit rearrangement section 224, and mapping section 226.

Bit dividing section 222 divides the input codeword sequence to the first codeword subsequence and the second codeword subsequence.

Bit rearrangement section 224 arranges a group of sequence constituent bits that forms the first codeword subsequence so that the bits are separated into systematic bits and parity bits.

Mapping section 226 receives as input the first codeword subsequence and the second codeword subsequence that are arranged in bit rearrangement section 224, and maps each of the first codeword subsequence and the second codeword subsequence. Mapping section 226, especially in the first codeword subsequence, maps a systematic bit with priority over a parity bit to a bit that belongs to a group having poor quality characteristics.

An operation of radio communication apparatus 200 having the above configuration will be described below.

In encoding processing section 210, turbo encoding processing is performed per fixed information block, and a codeword sequence is output.

In modulation section 220, mapping processing is performed on the codeword sequence obtained in encoding processing section 210.

Figure 8:
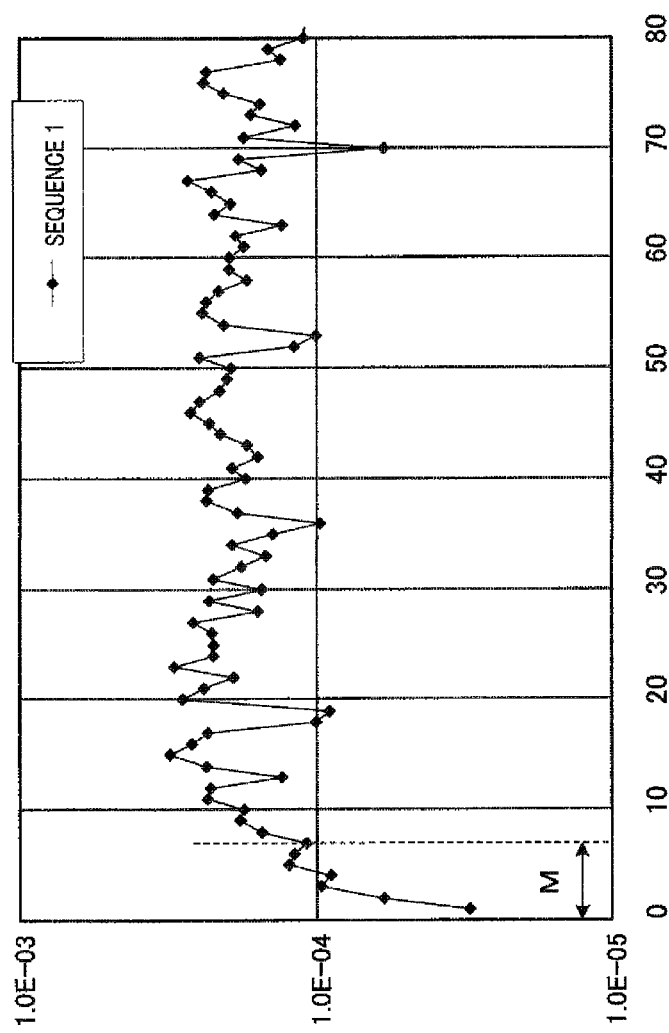
FIG. 8 shows error characteristics per bit position in a fixed information block with code constraint length K (turbo encoding scheme)

Here, error characteristics per bit position in a fixed information block formed with K bits when turbo encoding scheme is employed is shown in FIG. 8. In FIG. 8, the horizontal axis indicates a bit position and the vertical axis indicates a bit error rate (BER).

As shown in FIG. 8, the BER of the bit position group that formed with M bits in the head part of the fixed information block is good. Here, M bits are proportional to code constraint length V.

On the other hand, although the BER in the parts other than the above head part is poorer than the BER in the head part, the BER in certain bit positions is high. Here, the certain bit positions showing higher BER correspond to the bit positions that are to be positioned within M bits in the head part of the fixed information block that is interleaved in interleaver 212.

Therefore, modulation section 220, in the first codeword subsequence having better error characteristics than the second codeword subsequence, maps a systematic bit with priority over a parity bit to a bit that belongs to a group having poor quality characteristics in the group of bits forming one symbol.

Figure 9:
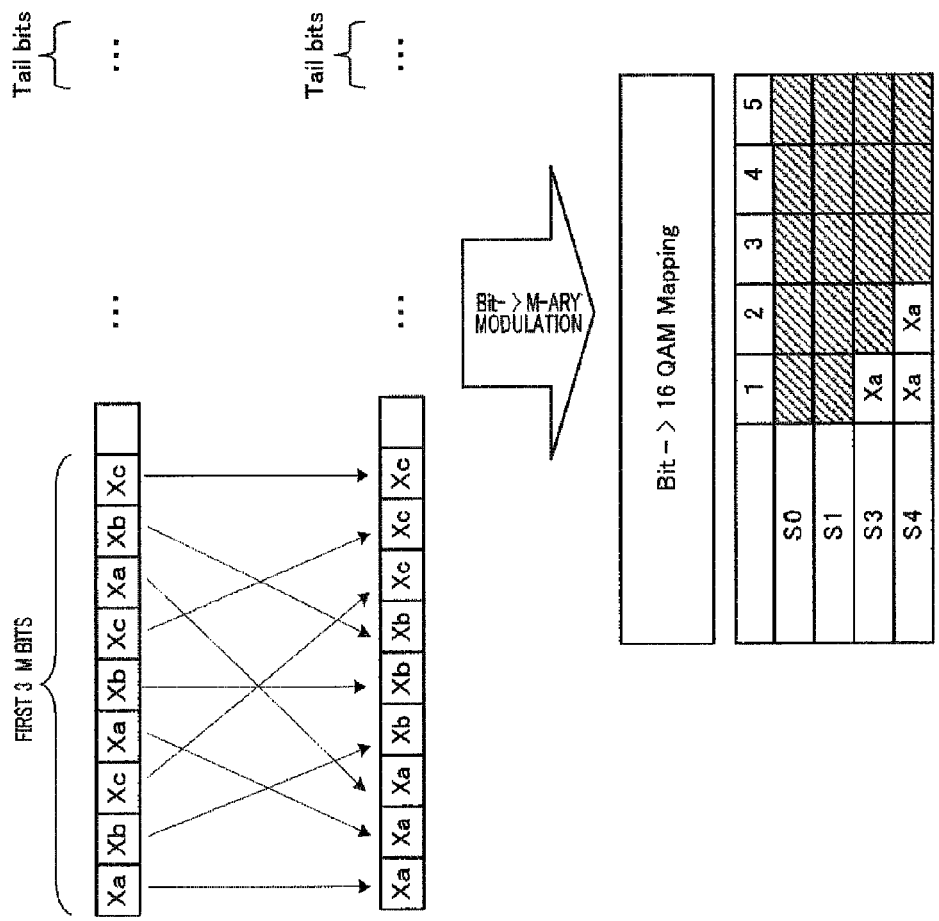
FIG. 9 shows processing in the modulation section shown in FIG. 5.
Figure 10:
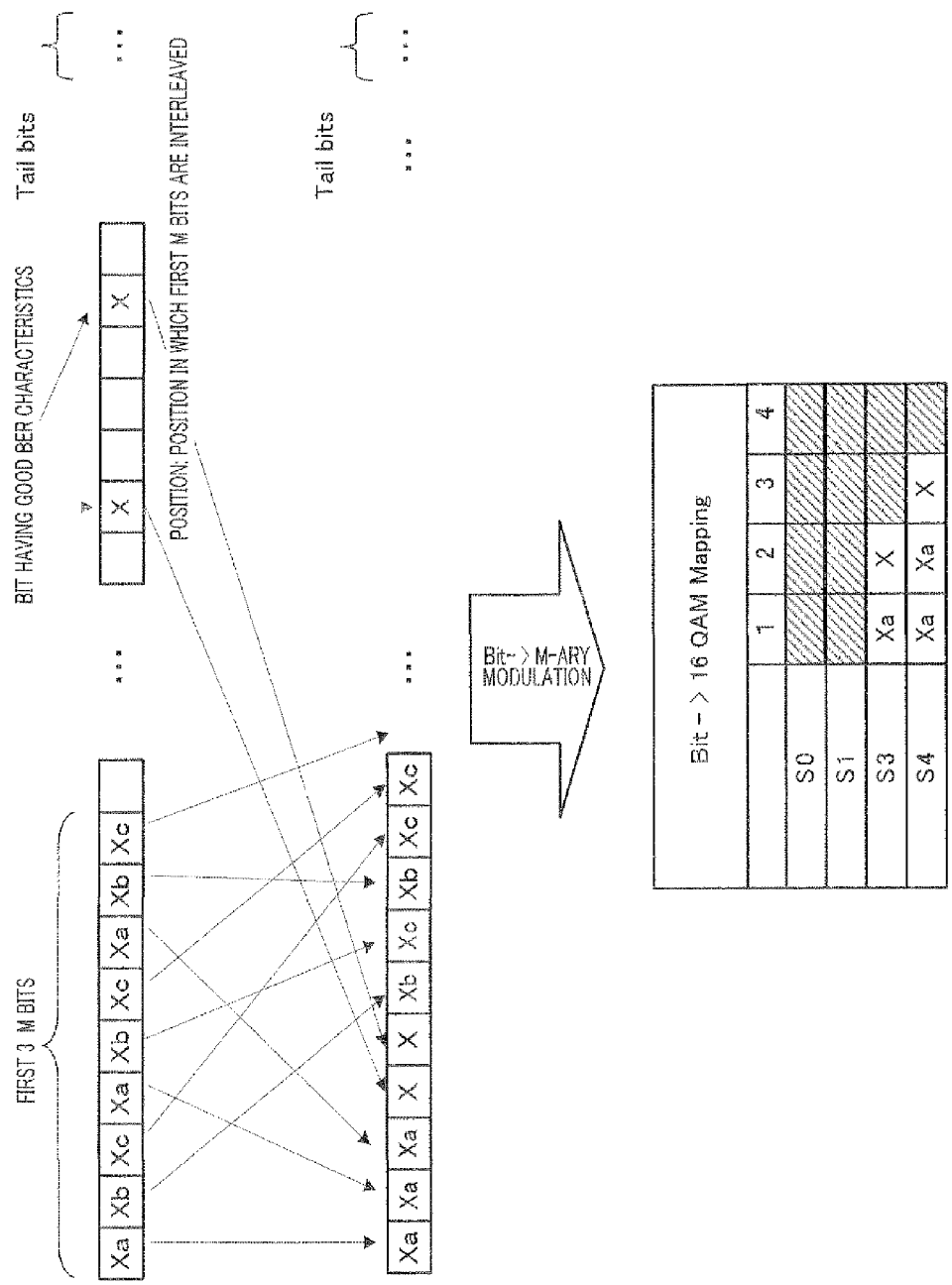
FIG. 10 shows processing in the modulation section shown in FIG. 5.

FIGS. 9 and 10 show processing in modulation section 220. FIGS. 9 and 10 show, in particular, a case where the coding rate is 1/3 and the modulation scheme is 16 QAM. Further, Xa in FIGS. 9 and 10 indicate a systematic bit, Xb and Xc indicate a parity bit, and Xa, Xb, and Xc correspond to the reference numerals in FIG. 6. However, FIG. 9 shows the first aspect in which part having higher BER by the influence of interleaving in interleaver 212 is not taken into account while FIG. 10 shows a second aspect in which the aforesaid part is taken into account.

In the case of the first aspect, in modulation section 220, as shown in the upper part in FIG. 9, bit rearrangement section 224 arranges a group of sequence constituent bits that forms the first codeword subsequence (the first 3×M bits in FIG. 9) so that the bits are separated into systematic bits and parity bits.

Then, as shown in the lower part in FIG. 9, in the first codeword subsequence, mapping section 226 maps a systematic bit with priority over a parity bit to a bit that belongs to a group having poor quality characteristics. Parity bits are mapped to the bits hatched with oblique lines in FIG. 9.

Further, in the case of the second aspect, in modulation section 220, as shown in the upper part in FIG. 10, bit rearrangement section 224 arranges a group of sequence constituent bits that forms the first codeword subsequence (the first 3×M bits and a specific group of bits having good BER FIG. 10) so that the bits are separated into systematic bits and parity bits.

Then, as shown in the lower part in FIG. 10, mapping section 226, in the first codeword subsequence, maps a systematic bit with priority over a parity bit to a bit that belongs to a group having poor quality characteristics. Parity bits are mapped to the bits hatched with oblique lines in FIG. 10.

By doing as described above, it is possible to smooth the reception quality characteristics in the first codeword subsequence having good error characteristics. Therefore, it is possible to prevent part having significantly poor reception quality characteristics from arising in the first codeword subsequence, consequently making it possible to improve the system throughput.

Further, it is possible to select the first aspect for 16 QAM and select the second aspect for 64 QAM. That is, it is possible to switch the first aspect and the second aspect according to the m-ary modulation value.

As described above, according to the present invention, in radio communication apparatus 200, encoding processing section 210 contains a convolutional encoder that performs convolutional encoding on a fixed information block formed with K bits, and modulation section 220, in a codeword subsequence that is obtained based on the head part and the tail part of the fixed information block, maps a systematic bit with priority over a parity bit to a bit that belongs to a group having poor quality characteristics in the group of bits forming one symbol.

By this means, it is possible to smooth the reception quality characteristics in the first codeword subsequence having good error characteristics. Therefore, it is possible to prevent part having significantly poor reception quality characteristics from arising in the first codeword subsequence, consequently making it possible to improve reception quality and system throughput.

The disclosure of Japanese Patent Application No. 2009-025121, filed on Feb. 5, 2009, including the specification, drawings and abstract, is incorporated herein by reference in its entirety.

INDUSTRIAL APPLICABILITY

The radio communication apparatus according to the present invention is useful for improving reception accuracy characteristics by devising modulation processing on codewords for each encoding scheme.

The invention claimed is:

1. A radio communication apparatus comprising:
an encoding section configured to obtain a codeword sequence by encoding a fixed information block formed with K bits; and
a modulation section configured to perform m-ary modulation on the codeword sequence, by dividing the codeword sequence into a first codeword subsequence and a second codeword subsequence, and by mapping bits in the first codeword subsequence and bits in the second codeword subsequence to symbols, wherein,
each of the symbols has a first bit position and a second bit position, the first bit position having a higher bit error rate than the second bit position,
the first codeword subsequence includes a systematic bit and a parity bit which have been obtained by encoding a head part and a tail part of the fixed information block,
the second codeword subsequence includes bits which have been obtained by encoding a center part of the fixed information block, the center part being not including the head part and the tail part, and
the modulation section is configured to map, the systematic bit in the first codeword subsequence to the first bit position and the parity bit in the first subsequence to the second bit position.

2. The radio communication apparatus according to claim 1, wherein the number of bits M that forms each of the head part and the tail part is proportional to code constraint length V.

3. The radio communication apparatus according to claim 1, wherein the modulation section comprises a rearrangement section configured to arrange a group of bits that forms the first codeword subsequence so that the bits are separated into systematic bits and parity bits.

4. The radio communication apparatus according to claim 1, wherein the encoding section is a convolutional encoder.

5. A radio communication apparatus comprising:
an encoding section configured to obtain a codeword sequence by interleaving and encoding a fixed information block formed with K bits; and
a modulation section configured to perform m-ary modulation on the codeword sequence, by dividing the codeword sequence into a first codeword subsequence and a second codeword subsequence, and by mapping bits in the first codeword subsequence and bits in the second codeword subsequence to symbols, wherein,
each of the symbols has a first bit position and a second bit position, the first bit position having a higher bit error rate than the second bit position,
the first codeword subsequence includes a systematic bit and a parity bit which have been obtained by interleaving and encoding a head part of the fixed information block,
the second codeword subsequence includes bits which have been obtained from another part of the fixed information block than the head part, and
the modulation section is configured to map, the systematic bit in the first codeword subsequence to the first bit position, and the parity bit in the first codeword subsequence to the second bit position.

* * * * *